(12) United States Patent
Schuette

(10) Patent No.: US 8,910,002 B2
(45) Date of Patent: Dec. 9, 2014

(54) NAND FLASH-BASED STORAGE DEVICE WITH BUILT-IN TEST-AHEAD FOR FAILURE ANTICIPATION

(75) Inventor: Franz Michael Schuette, Colorado Springs, CO (US)

(73) Assignee: OCZ Storage Solutions Inc., San Jose, CA (US)

( * ) Notice: Subject to any disclaimer, the term of this patent is extended or adjusted under 35 U.S.C. 154(b) by 798 days.

(21) Appl. No.: 12/862,176

(22) Filed: Aug. 24, 2010

(65) Prior Publication Data

US 2011/0047421 A1 Feb. 24, 2011

Related U.S. Application Data

(60) Provisional application No. 61/236,169, filed on Aug. 24, 2009.

(51) Int. Cl.

| | |
|---|---|
| *G11C 29/12* | (2006.01) |
| *G11C 16/34* | (2006.01) |
| *G11C 5/04* | (2006.01) |
| *G11C 16/04* | (2006.01) |
| *G11C 29/46* | (2006.01) |
| *G11C 29/52* | (2006.01) |
| *G11C 29/04* | (2006.01) |

(52) U.S. Cl.
CPC ............... *G11C 16/349* (2013.01); *G11C 5/04* (2013.01); *G11C 16/04* (2013.01); *G11C 29/46* (2013.01); *G11C 29/52* (2013.01); *G11C 2029/0409* (2013.01); *G11C 2029/0411* (2013.01)
USPC .......................................................... 714/723

(58) Field of Classification Search
CPC ...... G11C 29/52; G11C 16/349; G11C 29/00; G11C 16/04; G11C 2029/0409; G11C 2029/0411; G11C 29/46; G11C 29/765
USPC .................................................. 714/718, 723
See application file for complete search history.

(56) References Cited

U.S. PATENT DOCUMENTS

| | | | |
|---|---|---|---|
| 5,632,012 A | 5/1997 | Belsan et al. | |
| 6,014,755 A * | 1/2000 | Wells et al. | 714/6.13 |
| 6,034,831 A * | 3/2000 | Dobbek et al. | 360/53 |
| 6,292,869 B1 | 9/2001 | Gerchman et al. | |
| 6,848,063 B2 | 1/2005 | Rodeheffer et al. | |
| 7,707,481 B2 * | 4/2010 | Kirschner et al. | 714/763 |
| 7,765,426 B2 * | 7/2010 | Li | 714/6.13 |
| 8,010,873 B2 * | 8/2011 | Kirschner et al. | 714/763 |

(Continued)

*Primary Examiner* — Amine Riad
(74) *Attorney, Agent, or Firm* — Hartman Global IP Law; Gary M. Hartman; Michael D. Winter

(57) ABSTRACT

A test-ahead feature for non-volatile memory-based mass storage devices to anticipate device failure. The test-ahead feature includes a method performed with a solid-state mass storage device having a controller, a cache memory, and at least one non-volatile memory device. At least a first block is reserved on the at least one non-volatile memory device as a wear-indicator block and a plurality of second blocks are used for data storage. Information is stored corresponding to the number of write and erase cycles encountered by the second blocks during usage of the mass storage device, and the information is accessed to perform wear leveling among the second blocks. The wear-indicator blocks are subjected to an offset number of write and erase cycles in excess of the number of write and erase cycles encountered by the second blocks, after which an integrity check of the first block is performed.

24 Claims, 2 Drawing Sheets

(56) References Cited

U.S. PATENT DOCUMENTS

| | | |
|---|---|---|
| 8,195,978 B2 * | 6/2012 | Flynn et al. .................... 714/6.1 |
| 2002/0162075 A1 | 10/2002 | Talagala |
| 2007/0245068 A1 * | 10/2007 | Yero ............................. 711/103 |
| 2008/0010566 A1 * | 1/2008 | Chang et al. ................... 714/718 |
| 2009/0187785 A1 * | 7/2009 | Gonzalez et al. ................. 714/5 |
| 2010/0122140 A1 * | 5/2010 | Shen et al. ..................... 714/752 |
| 2010/0313065 A1 * | 12/2010 | Feeley et al. ...................... 714/6 |
| 2011/0047322 A1 * | 2/2011 | Allen et al. .................... 711/103 |
| 2011/0047421 A1 * | 2/2011 | Schuette ....................... 714/718 |
| 2011/0173484 A1 * | 7/2011 | Schuette et al. .................. 714/2 |
| 2011/0231730 A1 * | 9/2011 | Allen ............................ 714/758 |

* cited by examiner

NAND FLASH-BASED STORAGE DEVICE WITH BUILT-IN TEST-AHEAD FOR FAILURE ANTICIPATION

CROSS REFERENCE TO RELATED APPLICATIONS

This application claims the benefit of U.S. Provisional Application Nos. 61/236,169 filed Aug. 24, 2009. The contents of this prior application are incorporated herein by reference.

BACKGROUND OF THE INVENTION

The present invention generally relates to memory devices for use with computers and other processing apparatuses. More particularly, this invention relates to a non-volatile or permanent memory-based mass storage device using flash memory devices or any similar non-volatile memory devices for permanent storage of data.

Mass storage devices such as advanced technology (ATA) or small computer system interface (SCSI) drives are rapidly adopting non-volatile solid-state memory technology such as flash memory or other emerging solid-state memory technology, including phase change memory (PCM), resistive random access memory (RRAM), magnetoresistive random access memory (MRAM), ferromagnetic random access memory (FRAM), organic memories, or nanotechnology-based storage media such as carbon nanofiber/nanotube-based substrates. Currently the most common technology uses NAND flash memory as inexpensive storage memory.

Despite all its advantages with respect to speed and price, flash memory-based mass storage devices have the drawback of limited endurance and data retention caused by the physical properties of the floating gate within each memory cell, the charge of which defines the bit contents of each cell. Typical endurance for multilevel cell NAND flash is currently on the order of 10,000 write cycles at 50 nm process technology and approximately 3000 write cycles at 4×nm process technology, and endurance is decreasing with every process node. Given the constant changes in process technology, process geometry and, further, inherent design differences from one manufacturer to another, it is very difficult to predict failures even under constant environmental conditions as they exist in the lab. In the field, temperature fluctuations add another layer of variables to the difficulties of predicting data loss.

Write endurance problems are typically detected during writing data to a block, that is, if the programming of the block fails, the controller can issue a re-write to a different location on the array and flag the block as non-functional. Some additional complications come into play in this case as, for example, the "erratic behavior of write endurance fails," meaning that often a block fails after a given number of writes, for example after 5,000 cycles, but then recovers full functionality for another 5,000 cycles without additional failures.

From a data management standpoint, more problematic is the question of data retention. Even though flash memory is considered non-volatile, the memory cells do not have unlimited data retention since the data are stored in the form of a charge on the floating gate. Over time, these charges will dissipate regardless of how good the insulation through the tunnel oxide layer is. The leakage current responsible for the loss of data depends on several factors, primarily temperature and time. In this context the general term temperature encompasses absolute temperature, temperature changes both with respect to values and time, as well as peak and mean temperature parameters. Each design and process technology will react somewhat differently to exposure to these parameters, which increases the difficulty of assessing current leakage and, by extension, estimating the progression in loss of data. Additional contributing factors include near-field effects such as write disturbance to adjacent cells or read access to the same or different cells, generally referred to as read disturbances.

In view of the above, it should be apparent that there are no simple methods for modeling the behavior of any given cell within an array of NAND flash memory based on assumed environmental and usage patterns. On the system level, more complex algorithms might be able to approximate reliable failure prediction. However, because of the mismatch between data written from the host to the device and data written from the device controller to the non-volatile memory array, commonly referred to as write amplification, only the drive itself has reliable information about the number of program and erase cycles that are not accessible by the system. Because of these issues, sudden failures in the form of data loss can occur. In the easiest case, these failures are simple or multiple bit errors that are correctable through ECC algorithms such as Reed-Solomon (RS) or Bose-Ray-Chaudhuri-Hochquenghem (BCH) error correction. However, a more severe problem is the "sudden death" of a drive that can occur if critical data are lost, for example, in the file system or if the bit error rate exceeds the number of correctable errors. In either case, these failures are not correctable through ECC algorithms.

BRIEF DESCRIPTION OF THE INVENTION

The present invention provides an indicator-based test-ahead feature for flash memory-based mass storage devices to reliably anticipate device failure independent of the variations in design and environmental parameters.

According to a first aspect of the invention, a method is performed with a solid-state mass storage device having a controller, a cache memory, and at least one non-volatile memory device. The method entails reserving at least a first block on the at least one non-volatile memory device as a wear-indicator block and using a plurality of second blocks on the at least one non-volatile memory device for data storage, storing information corresponding to the number of write and erase cycles encountered by the second blocks during usage of the solid-state mass storage device and accessing the information to perform wear leveling among the second blocks, subjecting the wear-indicator blocks to an offset number of write and erase cycles that is in excess of the number of write and erase cycles encountered by the second blocks during usage of the solid-state mass storage device, and then performing integrity checks of the first block.

According to a second aspect of the invention, a solid-state mass storage device is provided that includes a controller, a cache memory, and at least one non-volatile memory device. The at least one non-volatile memory device is partitioned into at least a first block as a wear-indicator block and a plurality of second blocks for data storage. The solid-state mass storage device is adapted to subject the wear-indicator block to an offset number of write and erase cycles that is in excess of the number of write and erase cycles encountered by the second blocks during usage of the solid-state mass storage device. The solid-state mass storage device further includes means for predicting a failure of the second blocks based on a failure of the wear-indicator block.

As indicated above, a preferred aspect of the invention is that the method and solid-state mass storage device operate to anticipate the failure of a non-volatile memory device, and particularly a flash memory device, due to wear and degradation through the use of indicator blocks that are reserved on the memory device (or optionally another memory device on the mass storage device) and subjected to workloads higher than that of the data blocks of the memory device. As such, the invention seeks to predict the failure of a memory device through actual wear and degradation trends observed within certain blocks of the memory device, instead of trying to simulate failure and extrapolate data in a scenario where behavior is dependent on highly complex interactions between different mechanisms, for example, environmental parameters such as temperature or patterns and frequency of data accesses, and therefore very difficult to model.

Other objects and advantages of this invention will be better appreciated from the following detailed description.

DETAILED DESCRIPTION OF THE INVENTION

Figure 1:
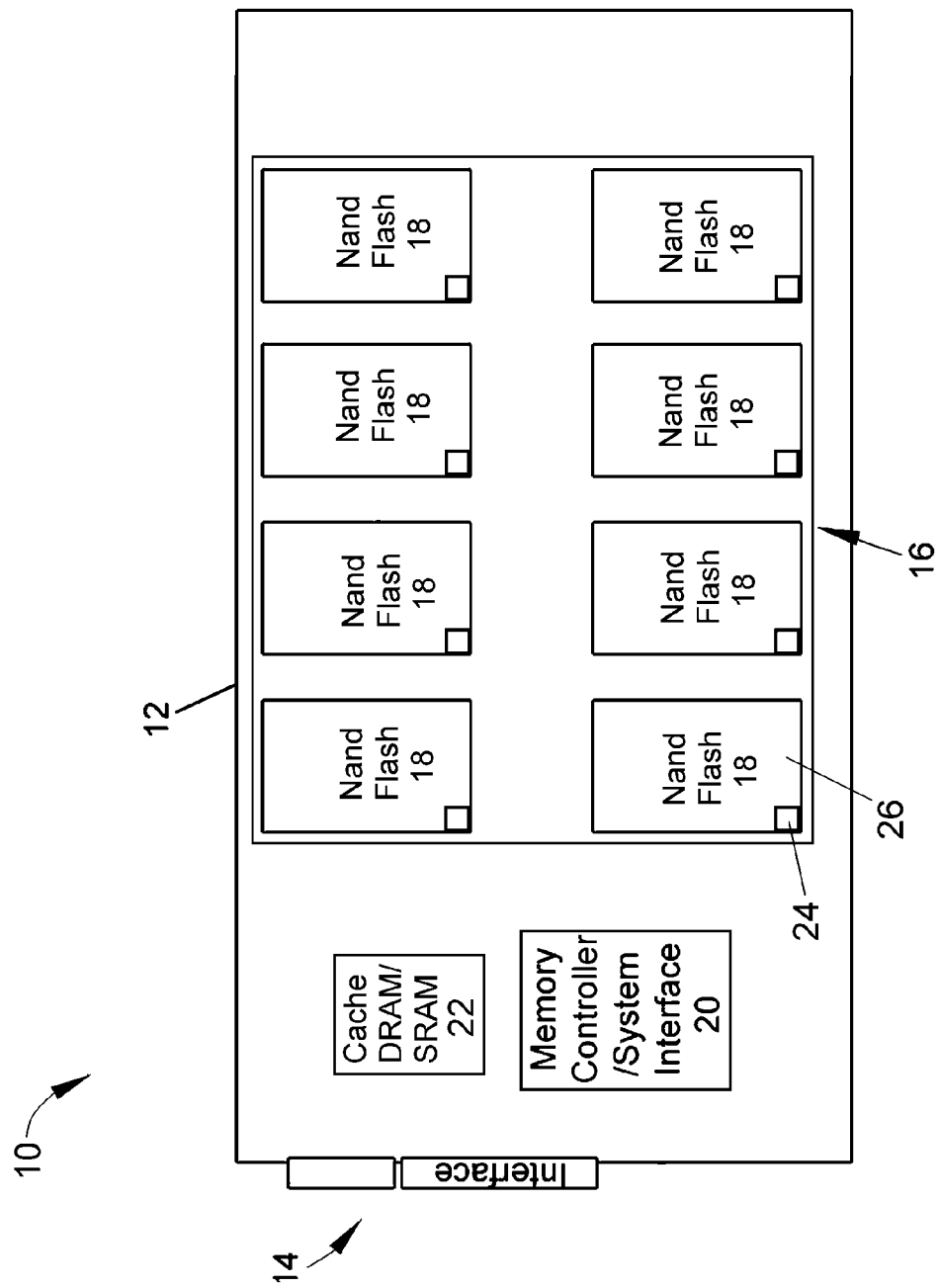
FIG. 1 is a schematic representation of a flash memory-based mass storage device (drive) with a plurality of memory devices, each containing a wear-indicator block for assessing the state of wear of the memory devices.

The present invention is generally applicable to computers and other processing apparatuses, and particularly to computers and apparatuses that utilize nonvolatile (permanent) memory-based mass storage devices, a notable example of which are solid-state drives (SSDs) that make use of NAND flash memory devices. FIG. 1 is schematically representative of such a SSD 10, though it should be understood that mass storage devices utilizing nonvolatile memory devices and having other than the classic "drive" form factor are also within the scope of this invention. The SSD 10 is represented as being configured as an internal mass storage device for a computer or other host system (not shown) equipped with a data and control bus for interfacing with the SSD 10. The bus may operate with any suitable protocol in the art, preferred examples being the advanced technology attachment (ATA) bus in its parallel or serial iterations, fiber channel (FC), small computer system interface (SCSI), and serially attached SCSI (SAS).

As known in the art, the SSD 10 is adapted to be accessed by the host system with which it is interfaced. In FIG. 1, this interface is through a connector (host) interface 14 carried on a drive package that includes a printed circuit board 12. Access is initiated by the host system for the purpose of storing (writing) data to and retrieving (reading) data from an array 16 of solid-state nonvolatile memory devices 18, each being an integrated circuit (IC) chip carried on the circuit board 12. According to a preferred aspect of the invention represented in FIG. 1, the memory devices 18 are NAND flash memory devices 18 that allow data to be stored, retrieved and erased on a block-by-block basis, with each block (or sector) being a predetermined section of a chip. The memory devices 18 are preferably accessed in parallel by a memory controller/system interface (controller) 20, through which data pass when being written to and read from the memory devices 18.

The controller 20 may comprise, for example, a host bus interface decoder and a memory controller capable of addressing the array 16 of memory devices 18. Protocol signals received through the interface 14 are translated by an abstraction layer of the controller 20 from logical to physical addresses on the memory devices 18 to which the data are written or from which they are read. The controller 20 also addresses a volatile memory cache chip 22 integrated on the SSD 10. The cache chip 22 may be, for example, DRAM or SRAM-based, as known in the art. Alternatively, the cache memory of the SSD 10 may be integrated on the controller 20, as also known in the art.

Existing SSDs typically use a process known as wear-leveling to monitor the number of accesses to any given block in a NAND flash memory array, store the data in a dedicated "house-keeping" portion of each memory device, and then select blocks with fewer re-write/erase cycles for the next storage of data. The effect of wear-leveling is that the access traffic to the NAND flash memory array is evenly distributed over all blocks by using an erase counter to monitor the erase cycles that precede any rewriting of data. The controller knows how many times each block has been erased/written to, and uses the blocks with the least number of erase/write cycles for the next data write cycle.

Consequently, if the SSD 10 of FIG. 1 were to operate in a conventional manner, all blocks within each NAND flash memory device 18, and by extension, the entire SSD 10, would be subjected to the same number of writes, with only small transient variations in numbers. This consistency in usage would provide the same level of wear across the entire array 16, within margins of error. Consequently, barring manufacturing tolerances and defect, the probability for failure should be the same for all blocks on any memory device 18 of the SSD 10. Arguably, there are differences caused, for example by the physical proximity of a memory device 18 to the controller 20 or the cache chip 22, both of which have typically a higher power dissipation than the NAND flash memory devices 18, and therefore also dissipate more heat. More heat, in turn, also changes some of the endurance and retention characteristics of the NAND flash memory devices 18, which is another reason to consider wear for each individual memory device 18.

As outlined above, wear of all blocks of the NAND flash memory devices 18 can be considered substantially equal across each entire device 18. At the same time, the controller 20 knows the number of cycles of all data blocks. According to a preferred aspect of the invention, certain blocks of the memory devices 18 of the SSD 10 are reserved as wear-indicator blocks 24 that are separate from the remaining blocks 26 serving as conventional data blocks for storing data. The wear-indicator blocks 24 are subjected to write, read and erase accesses according to the information in the wear-leveling data used on the data blocks 26 of the memory devices 18, but increased over the mean accesses of the data blocks 26 by an offset. The offset may be a fixed offset of additional write, read and/or erase cycles to which a wear-indicator block 24 may be subjected in excess of the write, read and/or erase cycles to the data blocks 26 of the same memory device 18, or may be a percentage-wise offset by which the write/read/erase cycles to the wear-indicator blocks 24 are increased on a percentage basis over the write/read/erase cycles to the data blocks 26. In this manner, the wear-indicator blocks 24 are accessed by what will be referred to hereafter as a "test-ahead" procedure, and the controller 20 of the SSD 10 can be used to provide the additional function of monitoring the wear-indicator blocks 24 of each device 18 for the purpose of anticipating a failure of the data blocks 26 of each device 18. The test-ahead offset is preferably predetermined to constitute an adequate buffer to predict a failure of the data blocks 26 prior to an actual failure of the data blocks 26.

A suitable test-ahead procedure is to test the wear-indicator blocks 24 using a standard procedure, for example, an ECC algorithm such as RS or BCH error correction to generate test-ahead data. Such an algorithm can be used to generate a checksum of a data range in the wear-indicator blocks 24, and then use subsequent reads to compare the checksum of the same data range with the actual data and monitor the number of bit errors (bit error rate; BER). Test-ahead detected fatigue of the wear-indicator blocks 24 within a memory device 18 will allow the controller 20 (or another suitable device on the SSD 10) to take appropriate corrective action, which may include media scrubbing, warning of the user of looming drive failure, or initiating of back-up procedures.

As an example of the above, if a standard write endurance of a NAND flash memory device manufactured on 50 nm process technology were estimated to be 10,000 cycles, a wear-indicator block 24 of the SSD 10 of this invention may be preprogrammed with, for example, a fixed offset of 500 additional erase/write cycles, and then subjected to additional dummy-write/erase cycles to trail the wear-leveling data applied to the data blocks 26 of the device 18. Alternatively, the controller 20 may be instructed to add a percentage-wise offset of, for example, 10% erase/write cycles over the mean usage of the data blocks 26. In the case of 1000 erase/write cycles per data block 26, the wear-indicator block 24 would then see 1100 erase/write cycles based on the 10% higher cycling frequency. The higher cycling frequency of the wear-indicator block 24 accelerates the probability of failure of the block 24 since it tends to result in a build-up of charges at broken atomic bond sites in the floating gate and the tunnel oxide layer of the block 24. The wear-indicator block 24 is therefore routinely tested for integrity as a part of the normal usage pattern of the memory device 18. However, since wear-indicator block 24 will be ahead of the data blocks 26 in terms of the usage and wear curves, the checking of data integrity and cell functionality can be considered as "test-ahead" of the general data block population of the memory device 18.

Usage patterns of the wear-indicator blocks 24 of the SSD 10 can either constitute fixed test patterns as, for example, checkerboard patterns or worst case scenarios like fully programmed cells, random samples from the last set of accesses to the data blocks 26, or some statistical averages of usage patterns of the data blocks 26. In addition, any combination of the different patterns in a temporal sequence or else in different locations of the wear-indicator blocks 24 can be used to generate a more intelligent prediction of loss of data retention or write endurance failure. Importantly, the wear-indicator blocks 24 can be conglomerated within the array 12 to test-ahead the effects of read/write disturbances without interfering with the actual data blocks 26 within the array 12.

Figure 2:
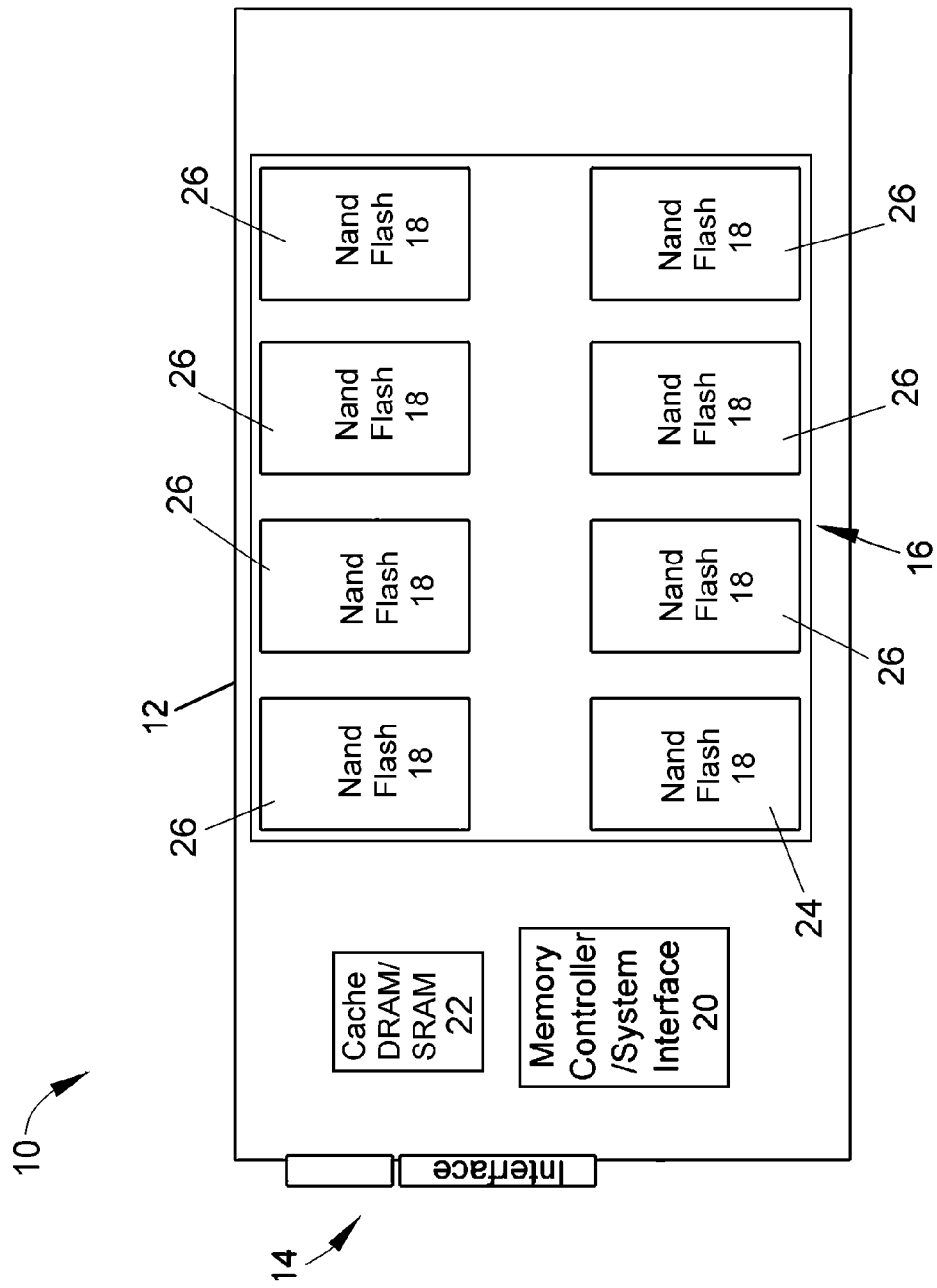
FIG. 2 is a schematic representation of a flash memory-based mass storage device (drive) with a plurality of memory devices, wherein only one of the memory devices contains a wear-indicator block for assessing the state of wear of other memory devices on the mass storage device.

In another embodiment of the invention represented in FIG. 2, instead of reserving a limited number of blocks of each device 18 of the SSD 10 as wear-indicator blocks 24, all blocks of one of the memory devices 18 of the SSD 10 could be used for test-ahead wear assessment without reserving any wear-indicator blocks on the remaining memory devices 18 of the SSD 10.

While certain components are shown and preferred for the test-ahead-enabled storage device of this invention, it is foreseeable that functionally-equivalent components could be used or subsequently developed to perform the intended functions of the disclosed components. Therefore, while the invention has been described in terms of a preferred embodiment, it is apparent that other forms could be adopted by one skilled in the art, and the scope of the invention is to be limited only by the following claims.

The invention claimed is:

1. A method for predicting a failure of a solid-state mass storage device having a controller, a cache memory, and at least one non-volatile memory device, the method comprising:
   reserving at least a first block on the at least one non-volatile memory device as a wear-indicator block and using a plurality of second blocks on the at least one non-volatile memory device for data storage;
   storing information corresponding to the number of write and erase cycles encountered by the second blocks during usage of the solid-state mass storage device and accessing the information to perform wear leveling among the second blocks;
   subjecting the wear-indicator blocks to an offset number of write and erase cycles that is in excess of the number of write and erase cycles encountered by the second blocks during usage of the solid-state mass storage device; and then
   performing integrity checks of the first block.

2. The method of claim 1, wherein the offset number of write and erase cycles is based on the information used to perform the wear leveling among the second blocks.

3. The method of claim 1, wherein the information comprises a mean access value of the second blocks based on the number of write and erase cycles encountered by the second blocks during usage of the solid-state mass storage device, and the offset number of write and erase cycles is an increase over the mean access value.

4. The method of claim 1, wherein the offset number of write and erase cycles is a fixed offset of additional write, read and/or erase cycles to which the wear-indicator block is subjected in excess of the write, read and/or erase cycles to the second blocks.

5. The method of claim 1, wherein the offset number of write and erase cycles is a percentage-wise offset by which the write, read and/or erase cycles to the wear-indicator block are increased on a percentage basis over the write, read and/or erase cycles to the second blocks.

6. The method of claim 1, wherein the offset number of write and erase cycles to the first block uses random data samples from a write to the second blocks, averaged samples of writes to the second blocks, or a predefined test pattern to write to the wear-indicator block.

7. The method of claim 1, wherein the step of performing integrity checks of the first block uses an ECC algorithm to generate a checksum of a data range in the first block and then monitor changes in the bit error rate on subsequent reads of the same data range.

8. The method of claim 1, further comprising the step of the controller 20 taking corrective action following the performing step, the corrective action being at least one chosen from the group consisting of performing media scrubbing of the second blocks, initiating an error warning, and initiating a back-up of data stored in the second blocks.

9. The method of claim 1, wherein the at least one non-volatile memory device of the solid-state mass storage device comprises a plurality of non-volatile memory devices.

10. The method of claim 9, wherein each of the non-volatile memory devices contains a wear-indicator block.

11. The method of claim 9, wherein only one of the non-volatile memory devices contains a wear-indicator block.

12. A solid-state mass storage device having a controller, a cache memory, and at least one non-volatile memory device, the at least one non-volatile memory device being partitioned into at least a first block as a wear-indicator block and a plurality of second blocks for data storage, the solid-state mass storage device being adapted to subject the wear-indicator block to an offset number of write and erase cycles that is in excess of the number of write and erase cycles encountered by the second blocks during usage of the solid-state mass storage device, the solid-state mass storage device further comprising means for predicting a failure of the second blocks based on a failure of the wear-indicator block.

13. The solid-state mass storage device of claim 12, further comprising means for storing information corresponding to the number of write and erase cycles encountered by the second blocks during usage of the solid-state mass storage device and accessing the information to perform wear leveling among the second blocks.

14. The solid-state mass storage device of claim 12, wherein the offset number of write and erase cycles is a fixed offset of additional write, read and/or erase cycles to which the wear-indicator block is subjected in excess of the write, read and/or erase cycles to the second blocks.

15. The solid-state mass storage device of claim 12, wherein the offset number of write and erase cycles is a percentage-wise offset by which the write, read and/or erase cycles to the wear-indicator block are increased on a percentage basis over the write, read and/or erase cycles to the second blocks.

16. The solid-state mass storage device of claim 12, wherein the predicting means comprises means for detecting an increase in the bit error rate between consecutive reads of the same data range in the wear-indicator block based on a comparison of the ECC checksum and the corresponding data range.

17. The solid-state mass storage device of claim 12, wherein the controller is adapted to take a corrective action in response to a failure of the wear-indicator block, the corrective action being at least one chosen from the group consisting of performing media scrubbing of the second blocks, initiating an error warning, and initiating a back-up of data stored in the second blocks.

18. The solid-state mass storage device of claim 12, wherein the at least one non-volatile memory device of the solid-state mass storage device comprises a plurality of non-volatile memory devices.

19. The solid-state mass storage device of claim 18, wherein each of the non-volatile memory devices contains a wear-indicator block.

20. The solid-state mass storage device of claim 18, wherein only one of the non-volatile memory devices contains a wear-indicator block.

21. The method of claim 1, wherein the at least one non-volatile memory device is a flash memory-based mass storage device.

22. The method of claim 1, wherein the at least one non-volatile memory device is a NAND flash memory-based mass storage device.

23. The solid-state mass storage device of claim 12, wherein the at least one non-volatile memory device is a flash memory-based mass storage device.

24. The solid-state mass storage device of claim 12, wherein the at least one non-volatile memory device is a NAND flash memory-based mass storage device.

* * * * *